(12) United States Patent
Rajendran et al.

(10) Patent No.: US 7,863,610 B2
(45) Date of Patent: Jan. 4, 2011

(54) INTEGRATED CIRCUIT INCLUDING SILICIDE REGION TO INHIBIT PARASITIC CURRENTS

(75) Inventors: Bipin Rajendran, White Plains, NY (US); Shoaib Hasan.Zaidi, Mechanicsville, VA (US)

(73) Assignees: Qimonda North America Corp., Cary, NC (US); International Business Machines Corporation, Armonk, NY (US)

( * ) Notice: Subject to any disclaimer, the term of this patent is extended or adjusted under 35 U.S.C. 154(b) by 266 days.

(21) Appl. No.: 11/843,044

(22) Filed: Aug. 22, 2007

(65) Prior Publication Data

US 2009/0052230 A1 Feb. 26, 2009

(51) Int. Cl.
*H01L 29/10* (2006.01)
*H01L 21/70* (2006.01)

(52) U.S. Cl. .................. 257/47; 257/112; 257/197; 257/288; 257/377; 257/382; 257/384; 257/454; 257/474; 257/486; 257/511

(58) Field of Classification Search .............. 257/288, 257/112, 377, 382, 384, 454, 486, 47, 197, 257/474, 511
See application file for complete search history.

(56) References Cited

U.S. PATENT DOCUMENTS

| 6,274,908 | B1* | 8/2001 | Yamaguchi et al. | 257/355 |
| 6,972,211 | B2 | 12/2005 | Hsu et al. | |
| 7,193,267 | B2 | 3/2007 | Hsu et al. | |
| 2008/0315171 | A1* | 12/2008 | Happ et al. | 257/4 |
| 2009/0052230 | A1* | 2/2009 | Rajendran et al. | 365/163 |
| 2009/0132781 | A1* | 5/2009 | Schnepper | 711/170 |

\* cited by examiner

*Primary Examiner*—Long K Tran
(74) *Attorney, Agent, or Firm*—Dicke, Billig & Czaja, PLLC

(57) ABSTRACT

An integrated circuit is disclosed. One embodiment includes a first diode, a second diode, and a semiconductor line coupled to the first diode and the second diode. The line includes a first silicide region between the first diode and the second diode.

24 Claims, 12 Drawing Sheets

INTEGRATED CIRCUIT INCLUDING SILICIDE REGION TO INHIBIT PARASITIC CURRENTS

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

A typical diode based cross-point or cross-bar memory array, such as a phase change memory array, a magnetic memory array, or other suitable resistive memory array may include parasitic leakage current paths between adjacent and nearby memory elements. The close proximity of the junction diodes may effectively provide an undesirable bipolar junction transistor (BJT) biased in its active region. This undesirable BJT is primarily due to the base transport factor between nearby P-N or N-P junction diodes sharing a common N+, N, P+, or P word line or bit line. The parasitic leakage current paths may interfere with reading data from and/or storing data to the memory array.

For these and other reasons, there is a need for the present invention.

SUMMARY

One embodiment provides an integrated circuit. The integrated circuit includes a first diode, a second diode, and a semiconductor line coupled to the first diode and the second diode. The line includes a first silicide region between the first diode and the second diode.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
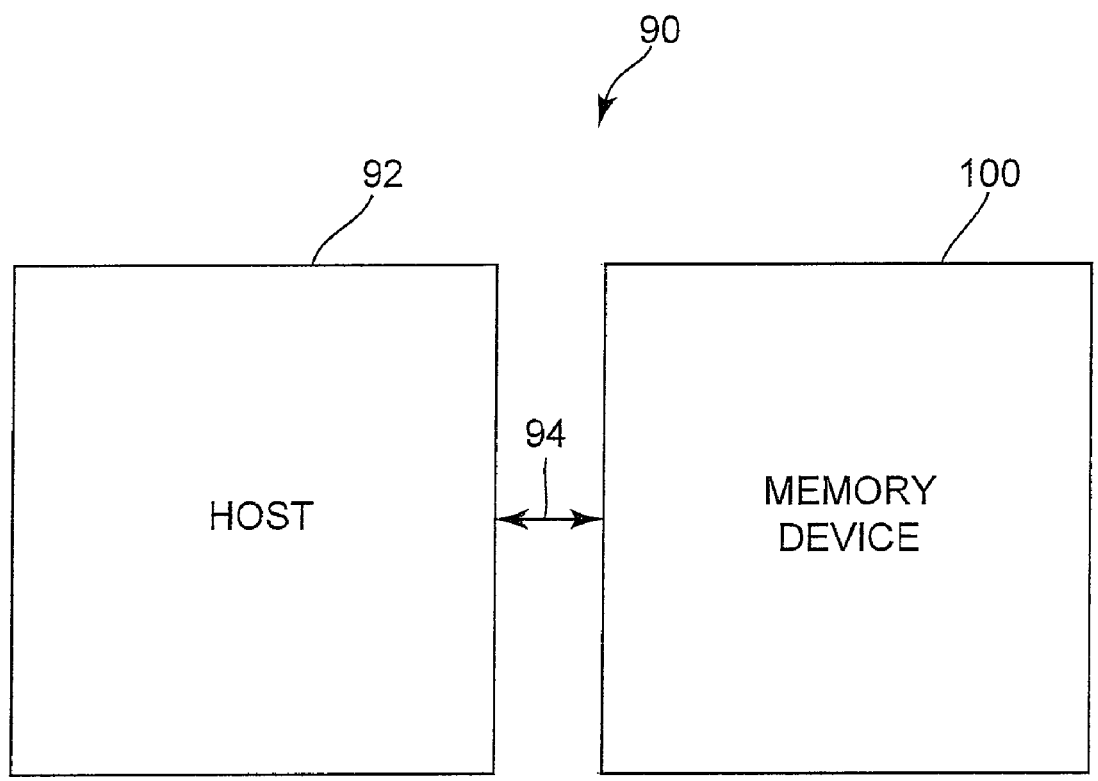
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
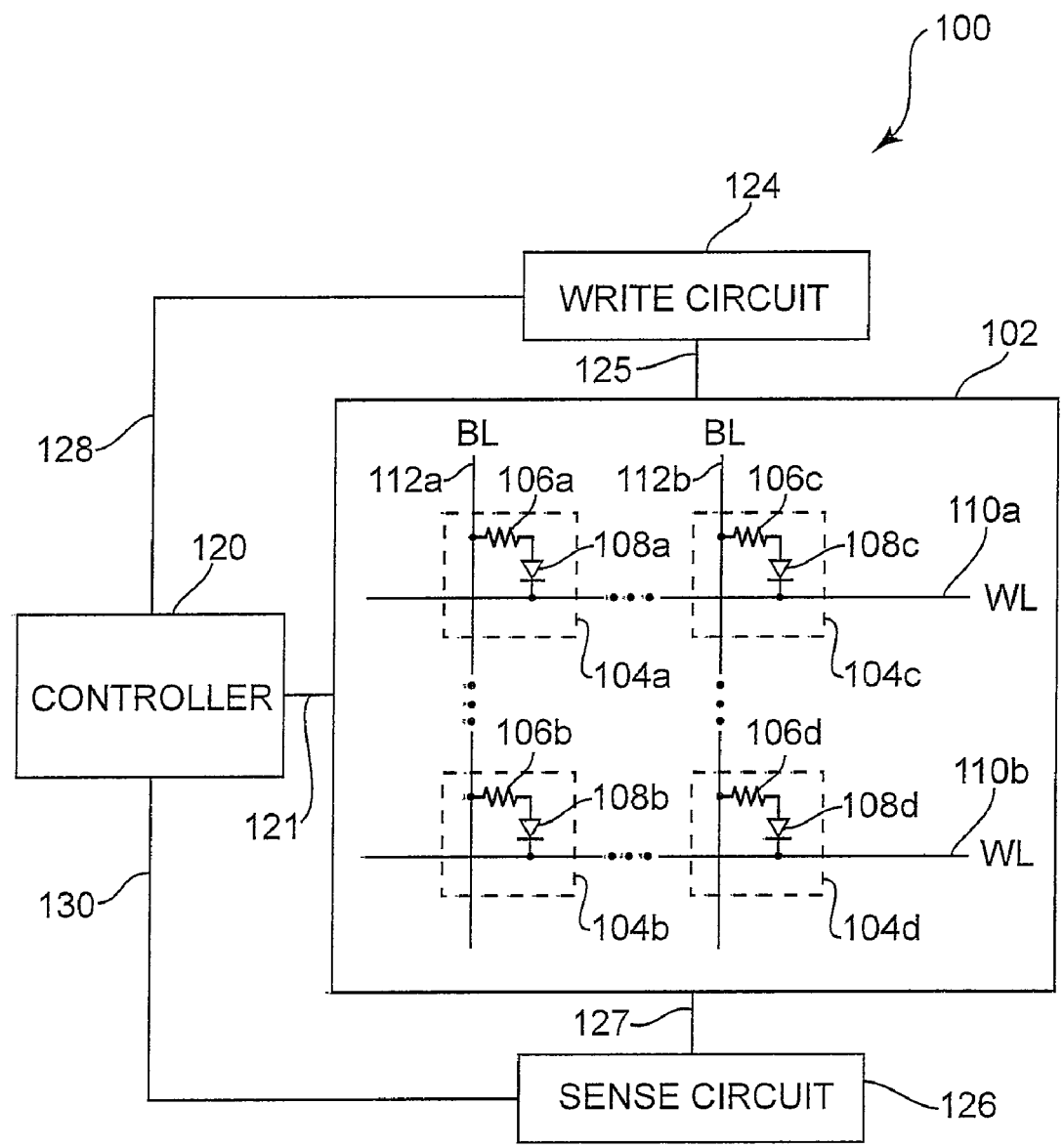
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes a write circuit 124, a controller 120, a memory array 102, and a sense circuit 126. Memory array 102 includes a plurality of resistive memory cells 104a-104d (collectively referred to as resistive memory cells 104), a plurality of bit lines (BLs) 112a-112b (collectively referred to as bit lines 112), and a plurality of word lines (WLs) 110a-110b (collectively referred to as word lines 110). In one embodiment, resistive memory cells 104 are phase change memory cells. In other embodiments, resistive memory cells 104 are another suitable type of resistive memory cells or resistivity changing memory cells, such as magnetic memory cells.

Each resistive memory cell 104 includes a memory element 106 and a diode 108. Each diode 108 contacts a word line 110. To prevent parasitic leakage current between adjacent and nearby diodes 108, selective regions of high recombination velocity are introduced into the current path between adjacent diodes 108 along each common word line 110. The regions are introduced without reducing the electrical conductivity of the word lines. In one embodiment, a metal such as Co or Ni is selectively incorporated into regions between adjacent diodes 108. The regions partially or completely intercept the current conduction pathways between diodes along each common word line 110. In another embodiment, the regions are introduced by forming silicide regions using a self-aligned silicide (SALICIDE) process.

As used herein, the term "electrically coupled" is not meant to mean that the elements must be directly coupled together and intervening elements may be provided between the "electrically coupled" elements.

Memory array 102 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110 and a bit line 112. Phase change memory cell 104a is electrically coupled to bit line 112a and word line 110a, and phase change memory cell 104b is electrically coupled to bit line 112a and word line 110b. Phase change memory cell 104c is electrically coupled to bit line 112b and word line 110a, and phase change memory cell 104d is electrically coupled to bit line 112b and word line 110b.

Each phase change memory cell 104 includes a phase change element 106 and a diode 108. Phase change memory cell 104a includes phase chance element 106a and diode 108a. One side of phase change element 106a is electrically coupled to bit line 112a, and the other side of phase change element 106a is electrically coupled to one side of diode 108a. The other side of diode 108a is electrically coupled to word line 110a. In another embodiment, the polarity of diode 108a is reversed.

Phase change memory cell 104b includes phase change element 106b and diode 108b. One side of phase change element 106b is electrically coupled to bit line 112a, and the other side of phase change element 106b is electrically coupled to one side of diode 108b. The other side of diode 108b is electrically coupled to word line 110b.

Phase change memory cell 104c includes phase change element 106c and diode 108c. One side of phase change element 106c is electrically coupled to bit line 112b and the other side of phase change element 106c is electrically coupled to one side of diode 108c. The other side of diode 108c is electrically coupled to word line 110a.

Phase change memory cell 104d includes phase change element 106d and diode 108d. One side of phase change element 106d is electrically coupled to bit line 112b and the other side of phase change element 106d is electrically coupled to one side of diode 108d. The other side of diode 108d is electrically coupled to word line 110b.

In another embodiment, each phase change element 106 is electrically coupled to a word line 110 and each diode 108 is electrically coupled to a bit line 112. For example, for phase change memory cell 104a, one side of phase change element 106a is electrically coupled to word line 110a. The other side of phase change element 106a is electrically coupled to one side of diode 108a. The other side of diode 108a is electrically coupled to bit line 112a.

In one embodiment, each resistive memory element 106 is a phase change element that comprises a phase change material that may be made up of a variety of materials in accordance with the present invention. Generally, chalcogenide alloys that contain one or more elements from Group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element may be changed from an amorphous state to a crystalline state or from a crystalline state to an amorphous state under the influence of temperature change. The amount of crystalline material coexisting with amorphous material in the phase change material of one of the phase change elements thereby defines two or more states for storing data within memory device 100. In the amorphous state, a phase change material exhibits significantly higher resistivity than in the crystalline state. Therefore, the two or more states of the phase change elements differ in their electrical resistivity. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that are assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 102 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

In one embodiment, during a "set" operation of phase change memory cell 104a, a set current or voltage pulse is selectively enabled by write circuit 124 and sent through bit line 112a to phase change element 106a thereby heating phase change element 106a above its crystallization temperature (but usually below its melting temperature). In this way, phase change element 106a reaches its crystalline state or a partially crystalline and partially amorphous state during this set operation.

During a "reset" operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state.

Phase change memory cells 104b-104d and other phase change memory cells 104 in memory array 102 are set and reset similarly to phase change memory cell 104a using a similar current or voltage pulse. In other embodiments, for other types of resistive memory cells, write circuit 124 provides suitable programming pulses to program the resistive memory cells 104 to the desired state.

Figure 3:
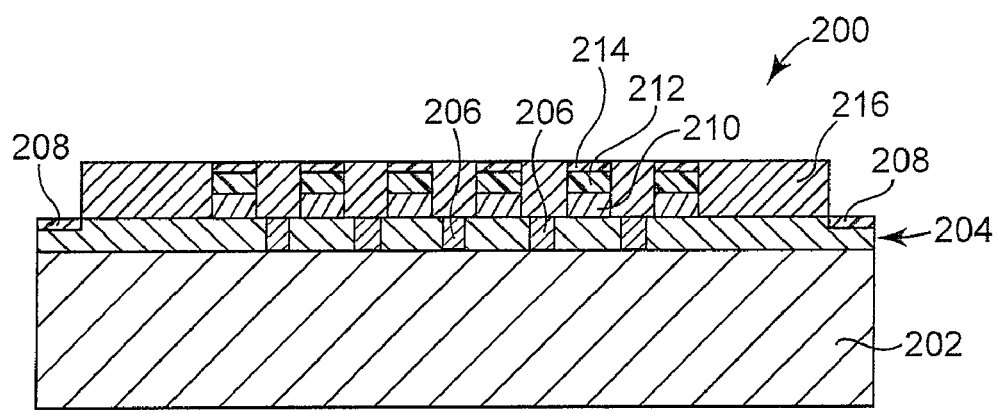
FIG. 3 illustrates a cross-sectional view of one embodiment of an array of diodes for accessing memory elements.

FIG. 3 illustrates a cross-sectional view of one embodiment of an array of diodes 200 for accessing memory elements. Array of diodes 200 includes a substrate 202, an N+ semiconductor line 204 including silicide regions 206 and 208, N regions 210, P regions 212, silicide contacts 214, and dielectric material 216. N regions 210 and P regions 212 provide diodes, such as diodes 108. In one embodiment, the polarity of the diodes and N+ semiconductor line 204 and the associated implants are reversed.

Substrate 202 is a Si substrate, Si on insulator (SOI) substrate, or other suitable substrate. N+ semiconductor line 204 is formed in substrate 202. The top of N+ semiconductor line 204 contacts the bottom of each N region 210. The top of each N region 210 contacts the bottom of a P region 212. The top of each P region 212 contacts the bottom of a silicide contact 214. The top of each silicide contact 214 is electrically coupled to a memory element (not shown), such as a resistive memory element 106.

Silicide regions 206 are formed in N+ semiconductor line 204 between N regions 210. Silicide regions 206 extend from the top of N+ semiconductor line 204 partially or completely through semiconductor line 204 toward substrate 202. In one embodiment, silicide regions also extend along the length of N+ semiconductor line 204 (not shown) perpendicular to silicide regions 206 at the upper corners of N+ semiconductor line 204. Silicide regions 206 prevent minority carriers from coupling between adjacent diodes, thereby reducing or eliminating parasitic leakage currents between the diodes. In addition, silicide regions 206 do not increase the resistivity of semiconductor line 204. Silicide regions 208 provide points for electrically coupling semiconductor line 204 to other circuits. Silicide regions 206 and 208 and silicide contacts 214 include CoSi, TiSi, NiSi, NiPtSi, WSiX, TaSi, or other suitable silicide. Dielectric material 216 laterally surrounds N regions 210, P regions 212, and silicide contacts 214. Dielectric material 216 includes $SiO_2$, $SiO_x$, SiN, fluorinated silica glass (FSG), boro-phosphorous silicate glass (BPSG), borosilicate glass (BSG), or other suitable dielectric material.

The following FIGS. 4-19B illustrate embodiments for fabricating an array of diodes for accessing memory elements, such as array of diodes 200 previously described and illustrated with reference to FIG. 3.

Figure 4:
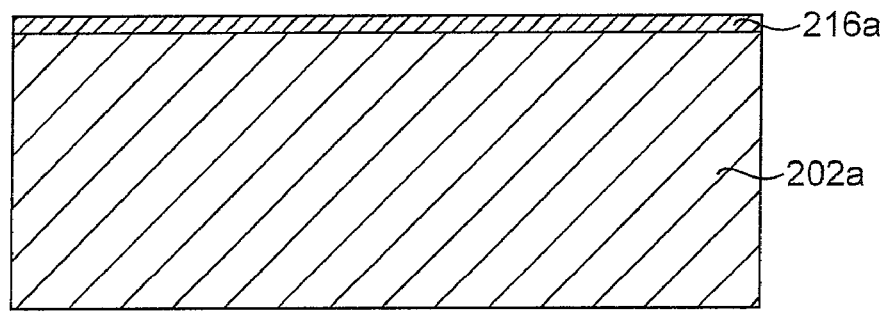
FIG. 4 illustrates a cross-sectional view of one embodiment of a substrate and a dielectric material layer.

FIG. 4 illustrates a cross-sectional view of one embodiment of a substrate 202a and a dielectric material layer 216a. A dielectric material, such as $SiO_2$, $SiO_x$, or other suitable dielectric material is deposited over substrate 202a to provide dielectric material layer 216a. Dielectric material layer 216a is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique.

Figure 5:
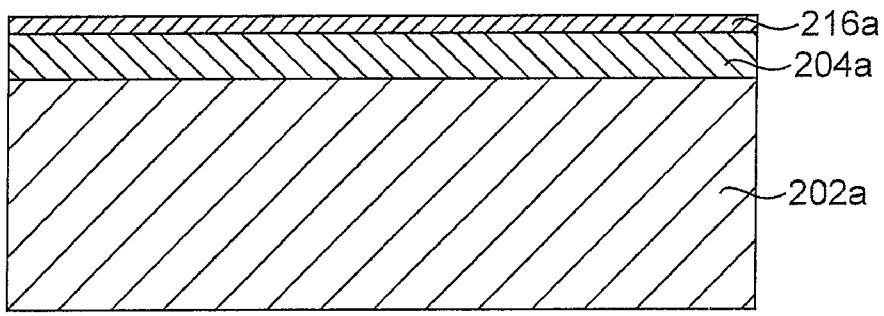
FIG. 5 illustrates a cross-sectional view of one embodiment of the substrate, the dielectric material layer, and an N+ semiconductor region after implanting a portion of the substrate.

FIG. 5 illustrates a cross-sectional view of one embodiment of substrate 202b, dielectric material layer 216a, and an N+ semiconductor region 204a after implanting a portion of substrate 202a. Substrate 202a is implanted with As, P, or other suitable implant to provide N+ semiconductor region 204a and substrate 202b. In another embodiment, substrate 202a is implanted to provide a P+ semiconductor region.

Figure 6:
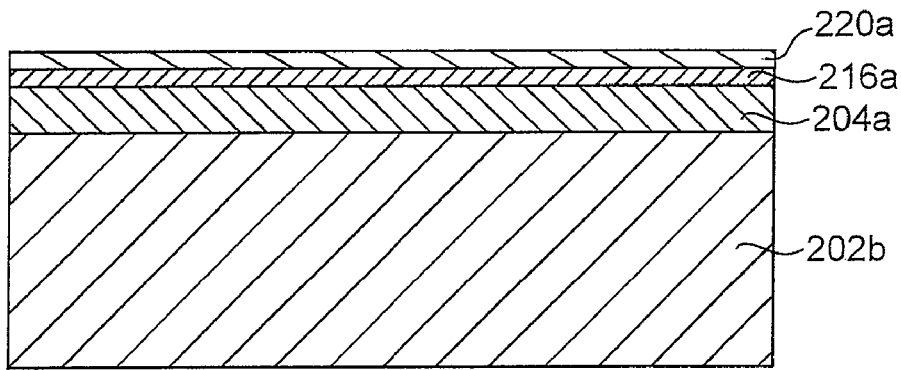
FIG. 6 illustrates a cross-sectional view of one embodiment of the substrate, the N+ semiconductor region, the dielectric material layer, and a hard mask material layer.

FIG. 6 illustrates a cross-sectional view of one embodiment of substrate 202b, N+ semiconductor region 204a, dielectric material layer 216a, and a hard mask material layer 220a. A hard mask material, such as SiN or another suitable hard mask material is deposited over dielectric material layer 216a to provide hard mask material layer 220a. Hard mask material layer 220a is deposited using CVD, HDP-CVD, ALD, MOCVD, PVD, JVD, or other suitable deposition technique.

Figure 7:
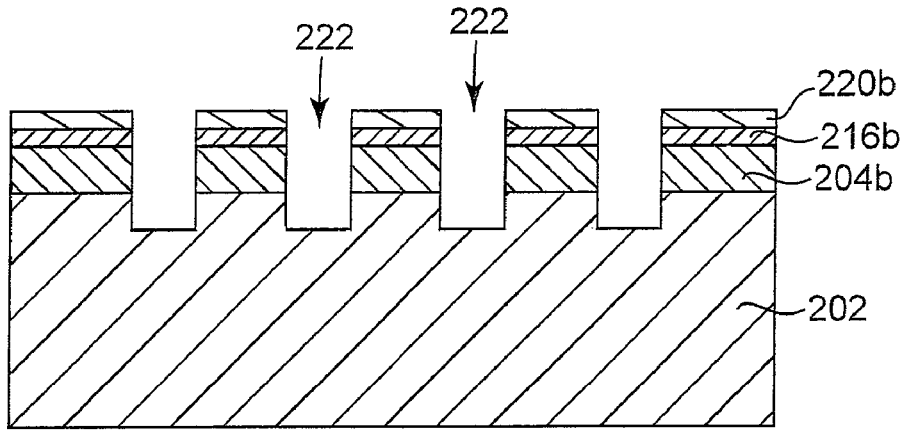
FIG. 7 illustrates a cross-sectional view of one embodiment of the substrate, the dielectric material layer, N+ semiconductor lines, and the hard mask material layer after etching openings in the hard mask material layer, the dielectric material layer, the N+ semiconductor region, and the substrate.

FIG. 7 illustrates a cross-sectional view of one embodiment of substrate 202, dielectric material layer 216b, N+ semiconductor lines 204b, and hard mask material layer 220b after etching openings 222 in hard mask material layer 220a, dielectric material layer 216a, N+ semiconductor region 204a, and substrate 202b. Hard mask material layer 220a, dielectric material layer 216a, N+ semiconductor region 204a, and substrate 202b are etched to provide openings 222 and substrate 202, dielectric material layer 216b, N+ semiconductor lines 204b, and hard mask material layer 220b. Openings 222 are trenches that extend across rows or columns of the memory array for providing shallow trench isolation (STI) for the memory array.

Figure 8:
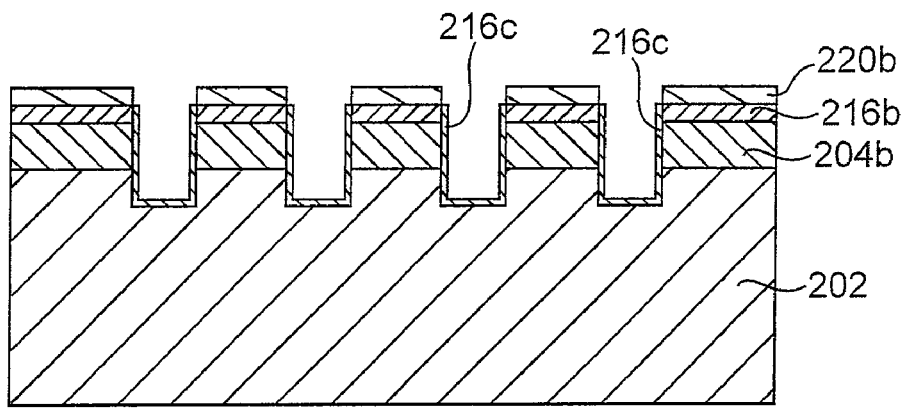
FIG. 8 illustrates a cross-sectional view of one embodiment of the substrate, the dielectric material layer, the N+ semiconductor lines, the hard mask material layer, and a dielectric material in the openings.

FIG. 8 illustrates a cross-sectional view of one embodiment of substrate 202, dielectric material layer 216b, N+ semiconductor lines 204b, hard mask material layer 220b, and a dielectric material 216c in openings 222. Exposed portions of dielectric material layer 216b, N+ semiconductor lines 204b, and substrate 202 are subjected to an STI passivation process to oxidize the exposed surfaces of dielectric material layer 216b, N+ semiconductor lines 204b, and substrate 202 to provide dielectric material 216c.

Figure 9:
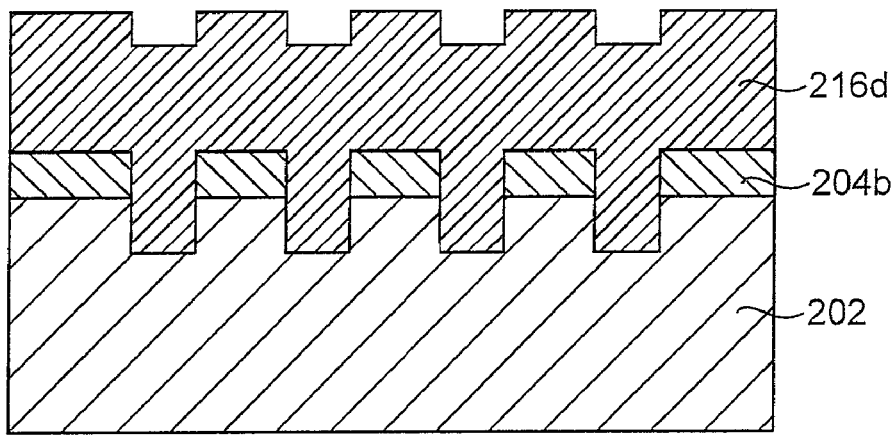
FIG. 9 illustrates a cross-sectional view of one embodiment of the substrate, the N+ semiconductor lines, and a dielectric material.

FIG. 9 illustrates a cross-sectional view of one embodiment of substrate 202, N+ semiconductor lines 204b, and a dielectric material 216d. Hard mask material layer 220b is removed using an etching process to expose dielectric material layer 216b. A dielectric material, such as $SiO_2$, $SiO_x$, SiN, FSG, BPSG, BSG, or other suitable dielectric material is deposited over exposed portions of dielectric material layer 216b and dielectric material 216c to provide dielectric material 216d, which includes dielectric material layer 216b and dielectric material 216c. The dielectric material is deposited using CVD, HDP-CVD, ALD, MOCVD, PVD, JVD, or other suitable deposition technique.

Figure 10:
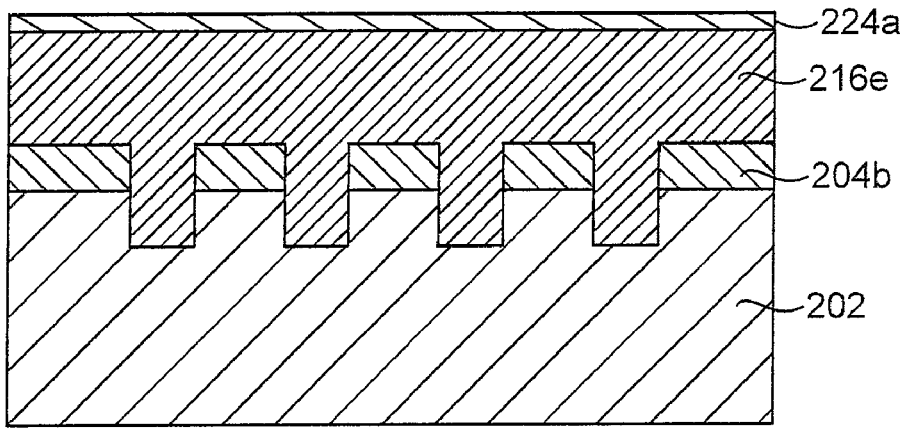
FIG. 10 illustrates a cross-sectional view of one embodiment of the substrate, the N+ semiconductor lines, the dielectric material, and a hard mask material layer.

FIG. 10 illustrates a cross-sectional view of one embodiment of substrate 202, N+ semiconductor lines 204b, dielectric material 216e, and a hard mask material layer 224a. Dielectric material 216d is planarized to provide dielectric material 216e. Dielectric material 216d is planarized using chemical mechanical planarization (CMP) or another suitable planarization technique.

A hard mask material, such as SiN or another suitable hard mask material is deposited over dielectric material 216e to provide hard mask material layer 224a. Hard mask material layer 224a is deposited using CVD, HDP-CVD, ALD, MOCVD, PVD, JVD, or other suitable deposition technique.

Figure 11:
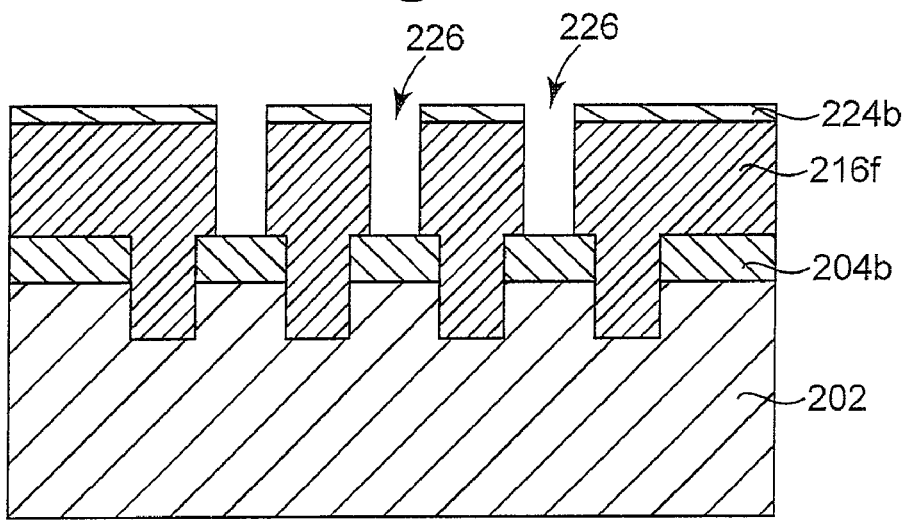
FIG. 11 illustrates a cross-sectional view of one embodiment of the substrate, the N+ semiconductor lines, the dielectric material, and the hard mask material layer after etching openings in the hard mask material layer and the dielectric material.

FIG. 11 illustrates a cross-sectional view of one embodiment of substrate 202, N+ semiconductor lines 204b, dielectric material 216f, and hard mask material layer 224b after etching openings 226 in hard mask material layer 224a and dielectric material 216e. Hard mask material layer 224a and dielectric material 216e are etched to provide openings 226 exposing portions of N+ semiconductor lines 204b and to provide hard mask material layer 224b and dielectric material 216f. In one embodiment, openings 226 are cylindrical in shape.

Figure 12:
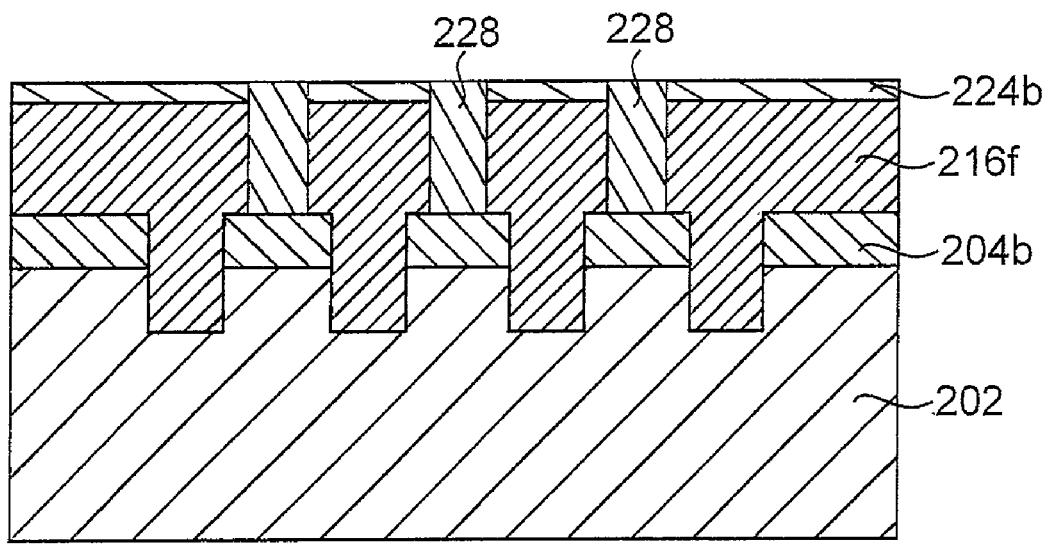
FIG. 12 illustrates a cross-sectional view of one embodiment of the substrate, the N+ semiconductor lines, the dielectric material, the hard mask material layer, and Si regions.

FIG. 12 illustrates a cross-sectional view of one embodiment of substrate 202, N+ semiconductor lines 204b, dielectric material 216f, hard mask material layer 224b, and Si regions 228. Openings 226 are filled with Si to provide Si regions 228. In one embodiment, epitaxy is used to fill openings 226 with Si to provide Si regions 228. In another embodiment, openings 226 are filled with amorphous Si and then annealed using a laser or another suitable method to provide single crystal or poly crystal Si regions 228.

Figure 13:
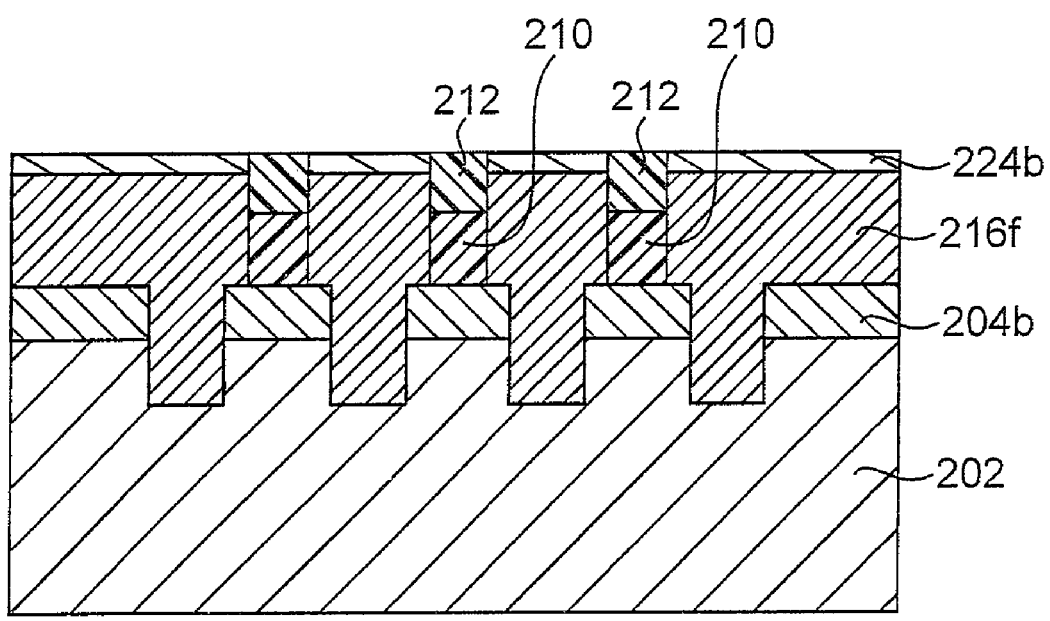
FIG. 13 illustrates a cross-sectional view of one embodiment of the substrate, the N+ semiconductor lines, the dielectric material, the hard mask material layer, N regions, and P regions.

FIG. 13 illustrates a cross-sectional view of one embodiment of substrate 202, N+ semiconductor lines 204b, dielectric material 216f, hard mask material layer 224b, N regions 210, and P regions 212. Silicon regions 228 are deeply implanted with N− implants to provide N regions 210. Silicon regions 228 are shallowly implanted with P+ implants to provide P regions 212. N regions 210 and P regions 212 provide diodes, such as diodes 108. In another embodiment, the polarity of the diodes and the associated implants are reversed. In other embodiments, the diodes are fabricated using other suitable processes, such as deposition and etching processes in place of or in combination with the epitaxy and/or implantation processes.

Figure 14A:
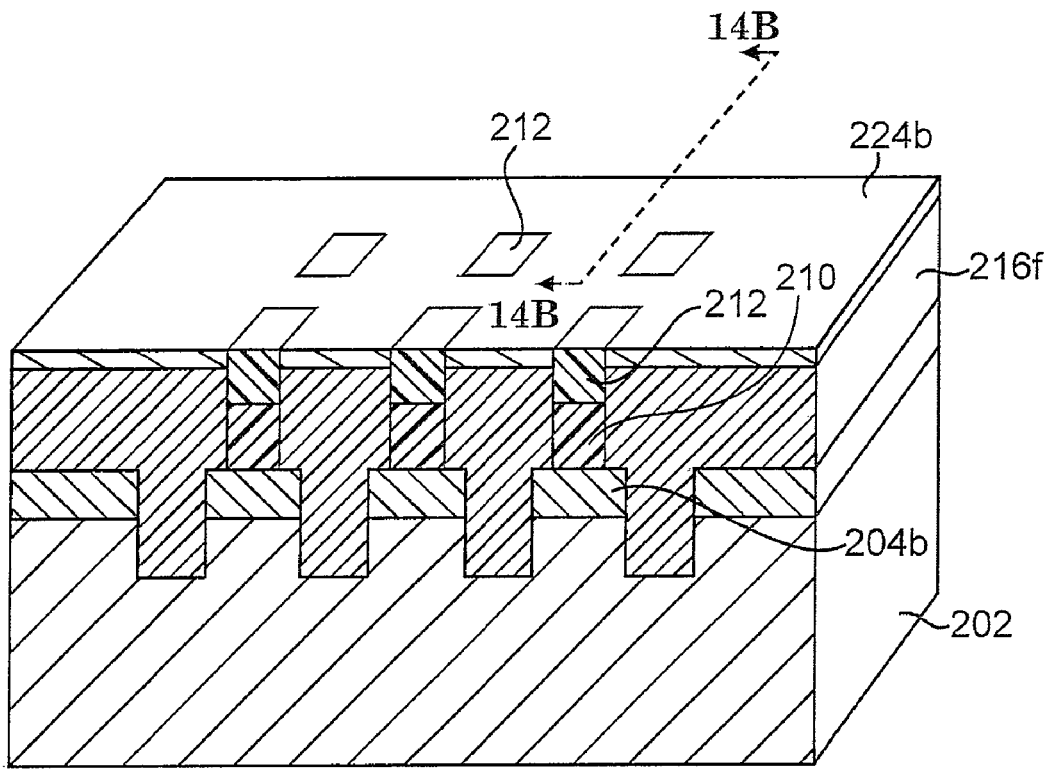
FIG. 14A illustrates a perspective view of one embodiment of the substrate, the N+ semiconductor lines, the dielectric material, the hard mask material layer, the N regions, and the P regions.

FIG. 14A illustrates a perspective view of one embodiment of substrate 202, N+ semiconductor lines 204b, dielectric material 216f, hard mask material layer 224b, N regions 210, and P regions 212. N regions 210 and P regions 212 provide a plurality of diodes along each N+ semiconductor line 204b.

Figure 14B:
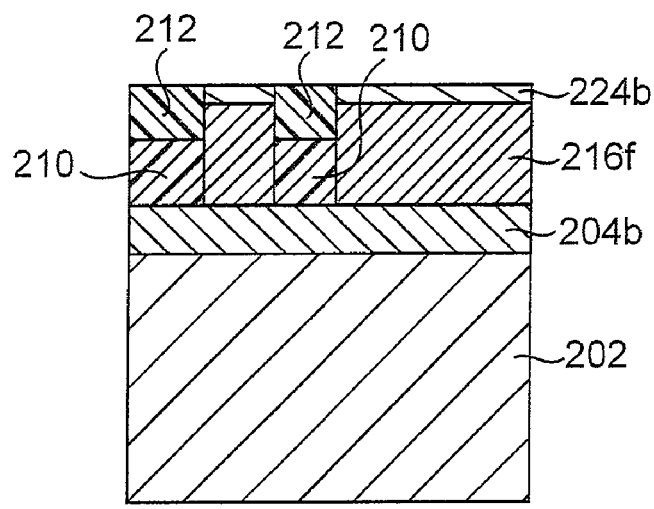
FIG. 14B illustrates a cross-sectional view of one embodiment of the substrate, an N+ semiconductor line, the dielectric material, the hard mask material layer, the N regions, and the P regions.

FIG. 14B illustrates a cross-sectional view of one embodiment of substrate 202, an N+ semiconductor line 204b, dielectric material 216f, hard mask material layer 224b, N regions 210, and P regions 212. FIG. 14B illustrates the cross-sectional view through a single N+ semiconductor line 204b as indicated in FIG. 14A.

Figure 15A:
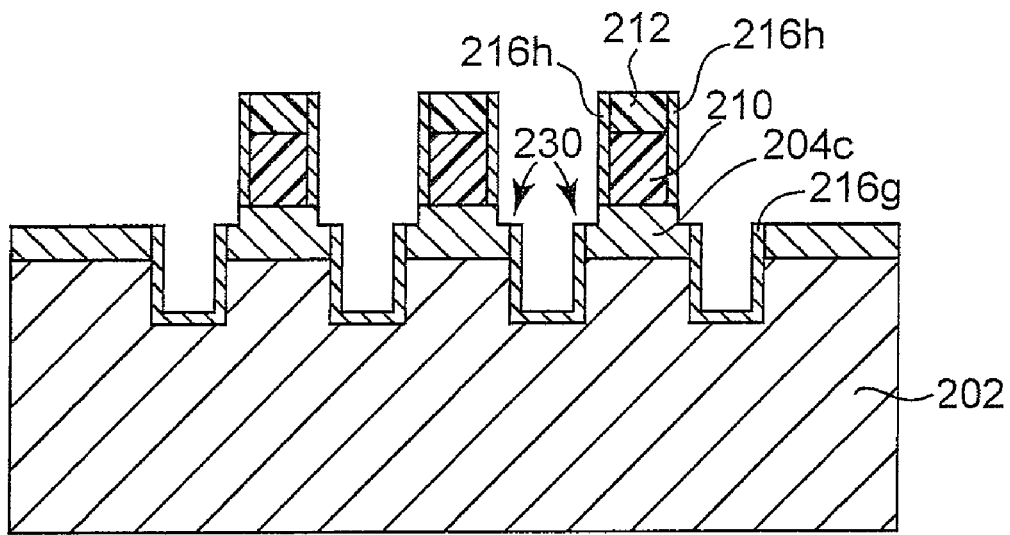
FIG. 15A illustrates a cross-sectional view of one embodiment of the substrate, the N+ semiconductor lines, dielectric material, the N regions, and the P regions after etching the hard mask material layer and the dielectric material.
Figure 15B:
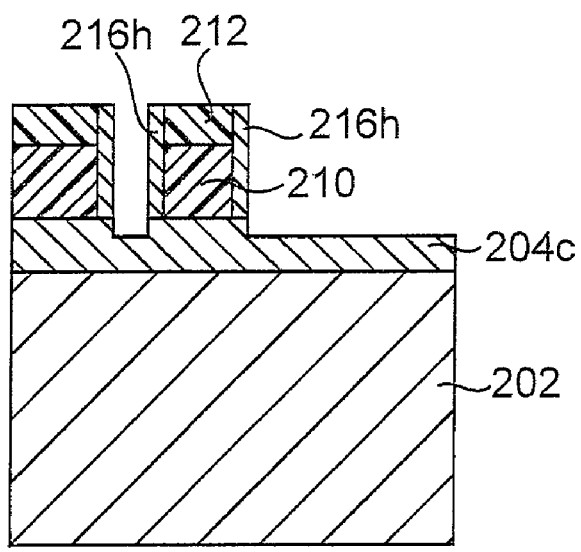
FIG. 15B illustrates a cross-sectional view perpendicular to the view illustrated in FIG. 15A of one embodiment of the substrate, the N+ semiconductor lines, dielectric material, the N regions, and the P regions after etching the hard mask material layer and the dielectric material.

FIG. 15A illustrates a cross-sectional view and FIG. 15B illustrates a cross-sectional view perpendicular to the view illustrated in FIG. 15A of one embodiment of substrate 202, N+ semiconductor lines 204c, dielectric material 216h and 216g, N regions 210, and P regions 212 after etching hard mask material layer 224b and dielectric material 216f. Hard mask material layer 224b is removed and dielectric material 216f is etched to provide dielectric material 216h and 216g. N+ semiconductor lines 204b are partially etched as indicated at 230 to provide N+ semiconductor lines 204c. Dielectric material 216h remains on the sidewalls of N regions 210 and P regions 212. In one embodiment, dielectric material 216g is completely removed.

Figure 16A:
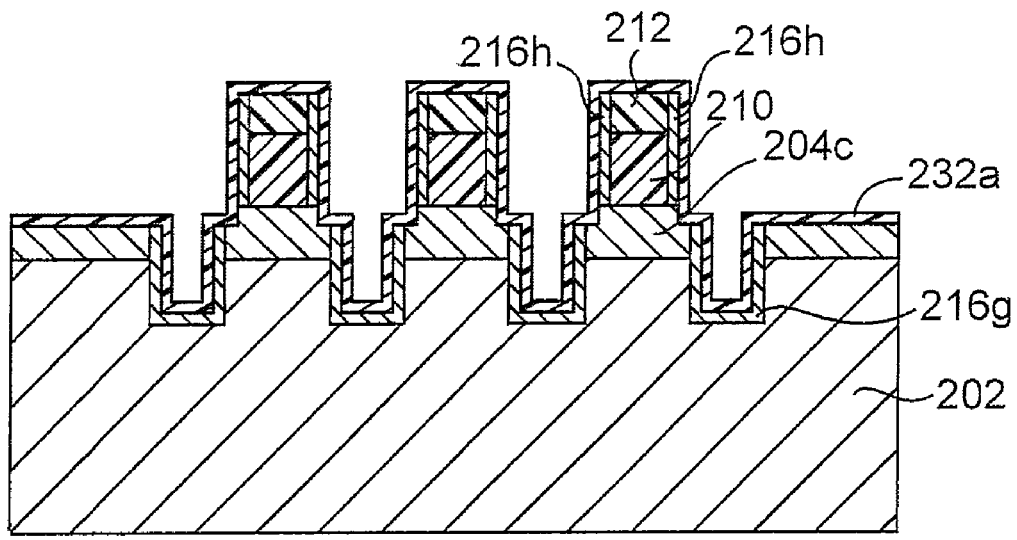
FIG. 16A illustrates a cross-sectional view of one embodiment of the substrate, the N+ semiconductor lines, the dielectric material, the N regions, the P regions, and a metal layer.
Figure 16B:
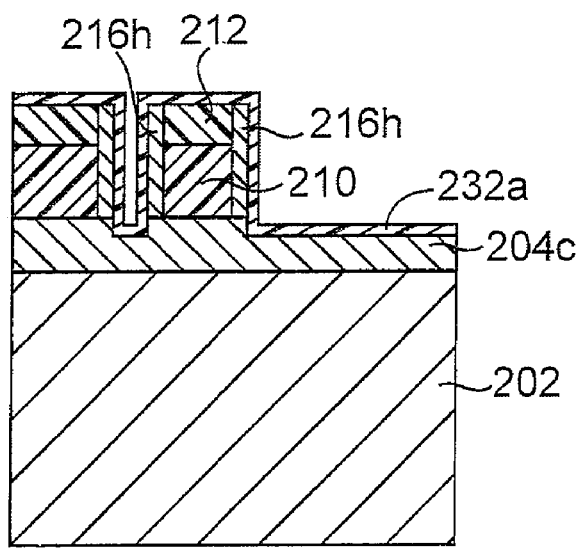
FIG. 16B illustrates a cross-sectional view perpendicular to the view illustrated in FIG. 16A of one embodiment of the substrate, the N+ semiconductor lines, the dielectric material, the N regions, the P regions, and a metal layer.

FIG. 16A illustrates a cross-sectional view and FIG. 16B illustrates a cross-sectional view perpendicular to the view illustrated in FIG. 16A of one embodiment of substrate 202, N+ semiconductor lines 204c, dielectric material 0.216h and 216g, N regions 210, P regions 212, and a metal layer 232a. A metal, such as Co, Ni, Ti, Ta, W, NiPt, or another suitable metal is conformally deposited over exposed portions of P regions 212, dielectric material 216h and 216g, and N+ semiconductor lines 204c to provide metal layer 232a. Metal layer 232a is deposited using CVD, HDP-CVD, ALD, MOCVD, PVD, JVD, or other suitable deposition technique.

Figure 17A:
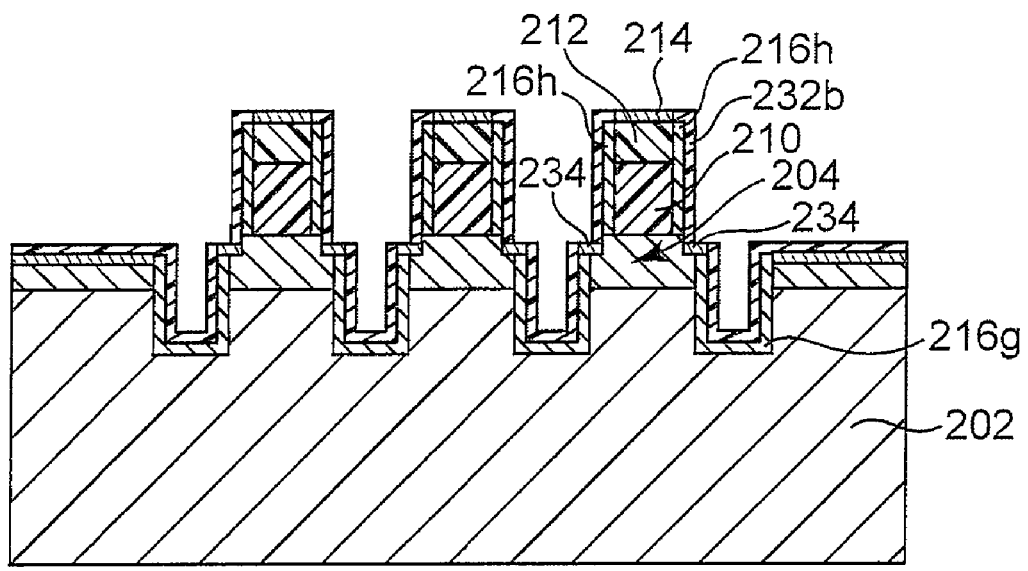
FIG. 17A illustrates a cross-sectional view of one embodiment of the substrate, the N+ semiconductor lines, the dielectric material, the N regions, the P regions, silicide, and the metal layer after annealing.
Figure 17B:
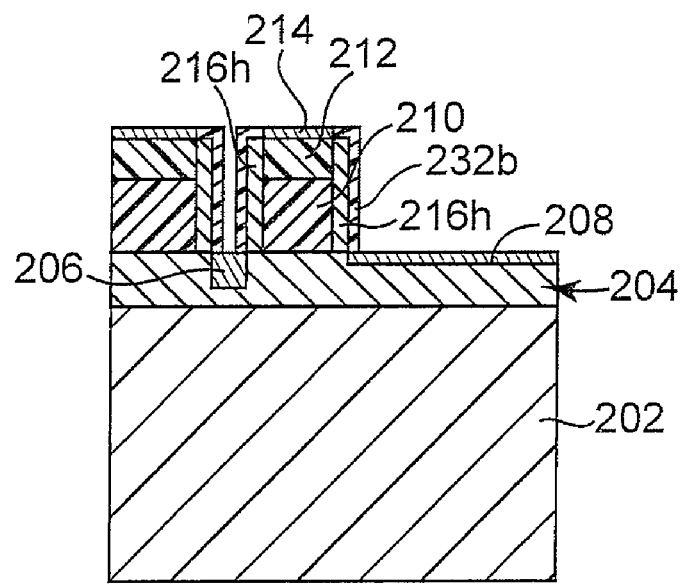
FIG. 17B illustrates a cross-sectional view perpendicular to the view illustrated in FIG. 17A of one embodiment of the substrate, the N+ semiconductor lines, the dielectric material, the N regions, the P regions, silicide, and a the metal layer after annealing.

FIG. 17A illustrates a cross-sectional view and FIG. 17B illustrates a cross-sectional view perpendicular to the view illustrated in FIG. 17A of one embodiment of substrate 202, N+ semiconductor lines 204, dielectric material 216h and 216g, N regions 210, P regions 212, silicide 206, 208, 214, and 234, and metal layer 232b after annealing. Metal layer 232a is annealed to form silicide contacts 214 and N+ semiconductor line 204 including silicide regions 206, 208, and 234. Metal layer 232a is annealed to form CoSi, TiSi, NiSi, NiPtSi, WSiX, TaSi, or other suitable silicide.

Silicide regions 206 extend partially through N+ semiconductor line 204 between N regions 210. In one embodiment, silicide regions 206 extend completely through N+ semiconductor line 204. Silicide regions 234 extend along the upper corners of N+ semiconductor line 204 perpendicular to silicide regions 206 on each side of N regions 210.

Figure 18A:
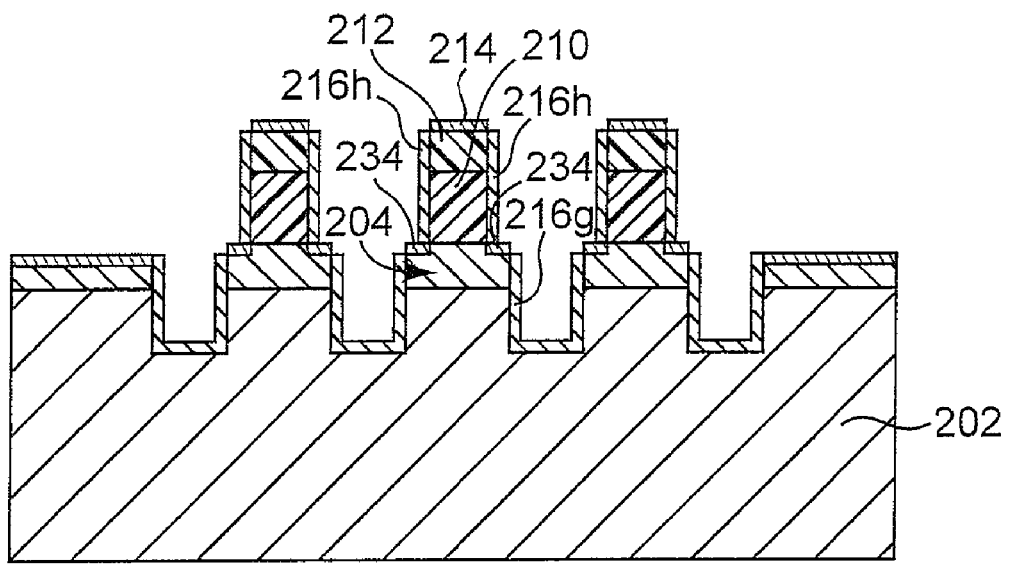
FIG. 18A illustrates a cross-sectional view of one embodiment of the substrate, the N+ semiconductor lines, the dielectric material, the N regions, the P regions, and the silicide after removing the unreacted metal.
Figure 18B:
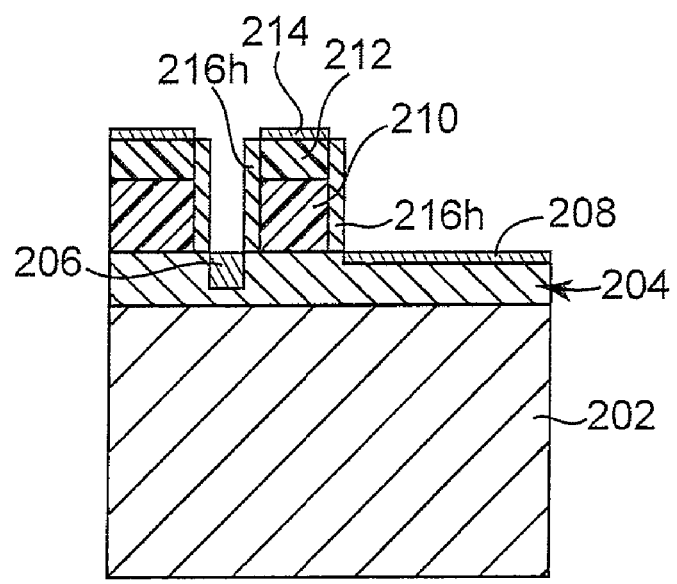
FIG. 18B illustrates a cross-sectional view perpendicular to the view illustrated in FIG. 18A of one embodiment of the substrate, the N+ semiconductor lines, the dielectric material, the N regions, the P regions, and the silicide after removing the unreacted metal.

FIG. 18A illustrates a cross-sectional view and FIG. 18B illustrates a cross-sectional view perpendicular to the view illustrated in FIG. 18A of one embodiment of substrate 202, N+ semiconductor lines 204, dielectric material 216h and 216g, N regions 210, P regions 212, and silicide 206, 208, 214, and 234 after removing unreacted metal 232b. Unreacted metal 232b is removed using a wet etch or another suitable etch. Silicide region 208 can be used in subsequent processing steps (e.g., CMP) for optical thin film measurements of dielectric material subsequently deposited over silicide region 208.

Figure 19A:
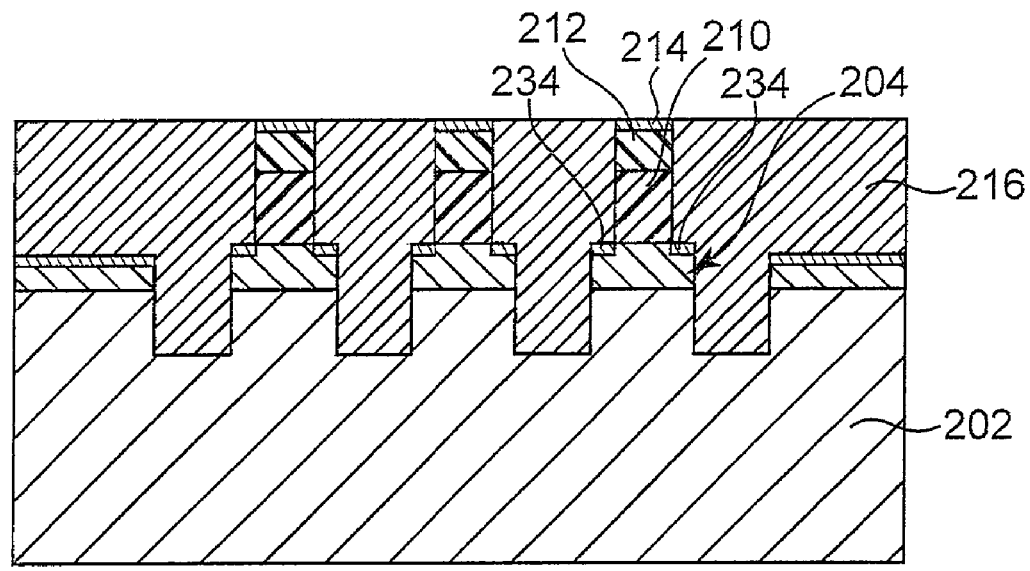
FIG. 19A illustrates a cross-sectional view of one embodiment of the substrate, the N+ semiconductor lines, dielectric material, the N regions, the P regions, and the silicide.
Figure 19B:
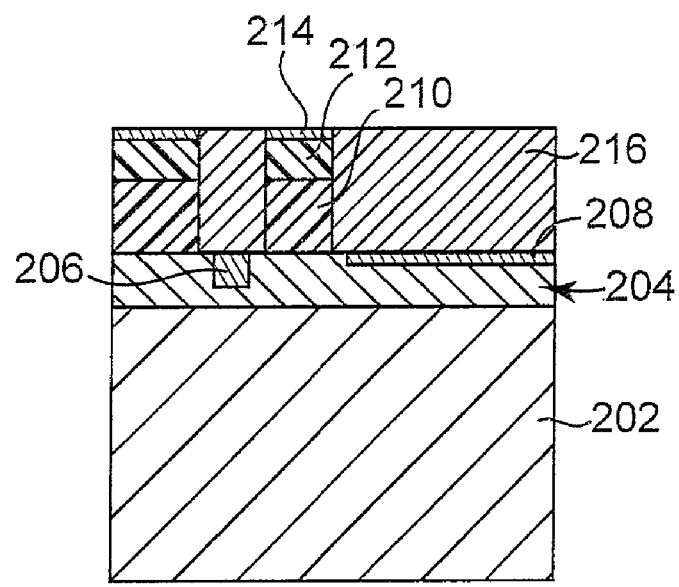
FIG. 19B illustrates a cross-sectional view perpendicular to the view illustrated in FIG. 19A of one embodiment of the substrate, the N+ semiconductor lines, dielectric material, the N regions, the P regions, and the silicide.

FIG. 19A illustrates a cross-sectional view and FIG. 19B illustrates a cross-sectional view perpendicular to the view illustrated in FIG. 19A of one embodiment of substrate 202, N+ semiconductor lines 204, dielectric material 216, N regions 210, P regions 212, and silicide 206, 208, 214, and 234. A dielectric material, such as $SiO_2$, $SiO_x$, SiN, FSG, BPSG, BSG, or other suitable dielectric material is deposited over exposed portions of silicide 206, 208, 214, and 234 and dielectric material 216h and 216g to provide a dielectric material layer, which includes dielectric material 216h and 216g. The dielectric material layer is deposited using CVD, HDP-CVD, ALD, MOCVD, PVD, JVD, or other suitable deposition technique. The dielectric material layer is then planarized to expose silicide contacts 214 to provide dielectric material 216. The dielectric material layer is planarized using CMP or another suitable planarization technique. Memory elements 106, bit lines 112, and upper metallization layers are then fabricated over silicide contacts 214 using additional deposition and etching processes to provide memory array 102.

Embodiments provide an array of diodes for accessing memory elements. Each diode is coupled to a word line formed in a substrate that includes silicide regions for reducing or inhibiting parasitic currents between adjacent or nearby diodes. The silicide regions provide minority carrier recombination centers in the current path and simultaneously enhance the conductivity of the word lines.

While the specific embodiments described herein substantially focused on using phase change memory elements, the present invention can be applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a first diode;
a second diode; and
a semiconductor line directly coupled to the first diode and the second diode, the line comprising a first silicide region between the first diode and the second diode.

2. The integrated circuit of claim 1, wherein the first silicide region is configured to inhibit minority carriers from coupling between the first diode and the second diode.

3. The integrated circuit of claim 1, wherein the first silicide, region is configured to inhibit parasitic currents between the first diode and the second diode.

4. The integrated circuit of claim 1, further comprising:
a first memory element coupled to the first diode; and
a second memory element coupled to the second diode.

5. The integrated circuit of claim 4, wherein the first memory element comprises a first resistive memory element, and
wherein the second memory element comprises a second resistive memory element.

6. The integrated circuit of claim 4, wherein the first memory element comprises a first phase change element, and wherein the second memory element comprises a second phase change element.

7. An integrated circuit comprising:
a first diode;
a second diode; and
a semiconductor line coupled to the first diode and the second diode, the line comprising a first silicide region between the first diode and the second diode,
wherein the line comprises a second silicide region extending perpendicular to the first silicide region.

8. The integrated circuit of claim 7, wherein the first silicide region is configured to inhibit minority carriers from coupling between the first diode and the second diode.

9. The integrated circuit of claim 7, wherein the first silicide region is configured to inhibit parasitic currents between the first diode and the second diode.

10. The integrated circuit of claim 7, further comprising:
a first memory element coupled to the first diode; and
a second memory element coupled to the second diode.

11. The integrated circuit of claim 10, wherein the first memory element comprises a first resistive memory element, and
wherein the second memory element comprises a second resistive memory element.

12. The integrated circuit of claim 10, wherein the first memory element comprises a first phase change element, and
wherein the second memory element comprises a second phase change element.

13. A memory comprising:
a first diode;
a second diode;
a line formed in a substrate, the line directly coupled to the first diode and the second diode; and
means for inhibiting minority carriers from coupling within the line between the first diode and the second diode without increasing a resistivity of the line.

14. The memory of claim 13, further comprising:
a first resistive memory element coupled to the first diode; and
a second resistive memory element coupled to the second diode.

15. The memory of claim 14, wherein the first resistive memory element comprises a first phase change element, and
wherein the second resistive memory element comprises a second phase change element.

16. The memory of claim 13, wherein the line comprises a silicide region extending perpendicular to the means for inhibiting minority carriers.

17. A system comprising:
a host; and
a memory device communicatively coupled to the host, the memory device comprising:
a first diode;
a second diode; and
a semiconductor line directly coupled to the first diode and the second diode, the semiconductor line comprising a recombination center in a current path between the first diode and the second diode.

18. The system of claim 17, wherein the silicide region extends partially through the semiconductor line.

19. The system of claim 17, wherein the recombination center comprises a silicide region.

20. The system of claim 19, wherein the semiconductor line comprises a further silicide region extending perpendicular to the silicide region.

21. The system of claim 17, wherein the memory device further comprises:
a first resistive memory element coupled to the first diode; and
a second resistive memory element coupled to the second diode.

22. The system of claim 21, wherein the memory device further comprises:
a first bit line coupled to the first resistive memory element; and
a second bit line coupled to the second resistive memory element,
wherein the semiconductor line comprises a word line.

23. The system of claim 22, wherein the memory device further comprises:
a write circuit configured to program the first resistive memory element and the second resistive memory element;
a sense circuit configured to read the first resistive memory element and the second resistive memory element; and
a controller configured to control the write circuit and the sense circuit.

24. The system of claim 21, wherein the first resistive memory element comprises a first phase change element, and
wherein the second resistive memory element comprises a second phase change element.

* * * * *